(12) United States Patent
Khazen et al.

(10) Patent No.: US 10,320,113 B2
(45) Date of Patent: Jun. 11, 2019

(54) CAGE RECEPTACLE ASSEMBLY WITH HEAT DISSIPATION UNITS

(71) Applicant: MELLANOX TECHNOLOGIES, LTD., Yokneam (IL)

(72) Inventors: Nimer Khazen, Ba'ne Village (IL); Yaniv Kazav, Hadera (IL); Ayal Shabtay, Haifa (IL); Michal Shlomai, Haifa (IL); Tom David, Haifa (IL); Kfir Katz, Kiryat Tivon (IL); Oren Weltsch, Tel Aviv (IL); Beeri Halachmi, Kfar Saba (IL); Aziz Mazbar, Haifa (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 15/786,222

(22) Filed: Oct. 17, 2017

(65) Prior Publication Data
US 2019/0115684 A1 Apr. 18, 2019

(51) Int. Cl.
*H05K 7/20* (2006.01)
*H01R 13/518* (2006.01)
*H01R 13/6582* (2011.01)
*G02B 6/44* (2006.01)
*G02B 6/42* (2006.01)
*H01R 13/6592* (2011.01)

(52) U.S. Cl.
CPC ......... *H01R 13/518* (2013.01); *G02B 6/4261* (2013.01); *G02B 6/4277* (2013.01); *G02B 6/4446* (2013.01); *H01R 13/6582* (2013.01); *H01R 13/6592* (2013.01); *H05K 7/20418* (2013.01)

(58) Field of Classification Search
None
See application file for complete search history.

(56) References Cited

U.S. PATENT DOCUMENTS

| | | | |
|---|---|---|---|
| 6,866,544 B1* | 3/2005 | Casey | H05K 9/0058 439/607.2 |
| 7,457,126 B2* | 11/2008 | Ahrens | G02B 6/4292 257/E23.088 |
| 8,670,236 B2* | 3/2014 | Szczesny | H05K 9/0009 165/104.33 |
| 8,823,540 B2 | 9/2014 | Scholeno | |
| 9,246,280 B2 | 1/2016 | Neer et al. | |
| 9,316,797 B2 | 4/2016 | Ista et al. | |
| 9,681,583 B2 | 6/2017 | Lei et al. | |
| 9,787,034 B2 | 10/2017 | Yang et al. | |

(Continued)

*Primary Examiner* — Courtney L Smith
(74) *Attorney, Agent, or Firm* — Alston & Bird LLP

(57) ABSTRACT

Apparatuses and associated methods of manufacturing are described that provide a cage receptacle assembly configured to receive a cable connector. The cage receptacle assembly includes a cage body defining a first end and a second end. The cage body includes a top cage member attached to a bottom cage member via two side portions of the top cage member, and the bottom cage member defines an opening. The cage receptacle assembly defines a heat dissipation unit disposed within the opening of the bottom cage member, and the heat dissipation unit includes one or more heat dissipation elements allowing heat to be transferred from the cable connector to an external environment of the cage receptacle assembly.

19 Claims, 11 Drawing Sheets

(56) References Cited

U.S. PATENT DOCUMENTS

| | | | |
|---|---|---|---|
| 9,893,474 B1* | 2/2018 | Jandt | H01R 13/665 |
| 9,924,615 B2 | 3/2018 | Bucher | |
| 2003/0159772 A1* | 8/2003 | Wolf | G02B 6/4277 |
| | | | 156/182 |
| 2003/0161108 A1 | 8/2003 | Bright et al. | |
| 2004/0027816 A1 | 2/2004 | Ice | |
| 2005/0195565 A1* | 9/2005 | Bright | H04B 1/036 |
| | | | 361/688 |
| 2010/0309626 A1 | 12/2010 | Xu et al. | |
| 2012/0281365 A1* | 11/2012 | Lima | H05K 7/20418 |
| | | | 361/720 |
| 2015/0029667 A1* | 1/2015 | Szczesny | F28D 15/0275 |
| | | | 361/700 |
| 2015/0280368 A1 | 10/2015 | Bucher | |
| 2015/0342090 A1* | 11/2015 | Yang | H01L 23/4093 |
| | | | 361/707 |
| 2016/0093996 A1* | 3/2016 | Phillips | H01R 24/60 |
| | | | 439/487 |
| 2016/0238805 A1 | 8/2016 | McColloch | |

\* cited by examiner

CAGE RECEPTACLE ASSEMBLY WITH HEAT DISSIPATION UNITS

BACKGROUND

The present disclosure relates in general to optical, active, and high-powered cables and associated connector assemblies used in conjunction with datacenter switch systems, modules, and other optical and electrical components. In particular, cages, shells, and housings of connector and receptacle assemblies are described which utilize heat dissipation units and elements that are configured to increase the thermal performance of datacenter connections.

Datacenter switch systems and associated modules may generally include connections between other switch systems, servers, racks, and devices. Such connections may be made using cables, transceivers, cage receptacles, and connector assemblies, which may include a shell or housing configured to protect these connections from damage. Often, these cage receptacles can generate heat during operation, which can result in the failure of system components. The inventors have identified numerous other deficiencies with existing technologies in the field, the remedies for which are the subject of the embodiments described herein.

BRIEF SUMMARY

Accordingly, the apparatuses and methods of manufacturing described herein provide a cage receptacle assembly configured to receive a cable connector. In some embodiments, the cage receptacle assembly may include a cage body defining a first end and a second end. The cage body may include a top cage member defined by a top portion and two side portions and a bottom cage member attached to the top cage member via the two side portions of the top cage member. The bottom cage member may define an opening and the cage body may define a receiving space configured to at least partially receive a cable connector therein via the first end such that a top surface of the cable connector is disposed proximate the top cage member and a bottom surface of the cable connector is disposed proximate the bottom cage member. The second end may be configured to be received by a datacenter rack for enabling signals to pass between the cable connector that is at least partially received therein and the datacenter rack. The cage body may also define a heat dissipation unit disposed within the opening. The heat dissipation unit may further include one or more heat dissipation elements configured to allow heat to be transferred from the cable connector that is at least partially received within the receiving space to an external environment of the cage receptacle assembly.

In some embodiments, the cage receptacle assembly may further include a printed circuit board assembly disposed adjacent the bottom cage member. The printed circuit board assembly may also define a corresponding opening configured to substantially align with the opening defined by the bottom cage member.

In some cases, the heat dissipation unit disposed within the opening defined by the bottom cage member may also be configured to be disposed within the corresponding opening of the printed circuit board assembly. In such a case, the heat dissipation unit may also be dimensioned such that, when disposed within the corresponding opening of the printed circuit board assembly, contact between the heat dissipation unit and the printed circuit board assembly is precluded.

In other cases, in an instance in which the cable connector is at least partially received within the cage body, the cage receptacle assembly may further be configured such that the heat dissipation unit contacts the cable connector.

In some other embodiments, the bottom cage member may be integral to the top cage member.

In some further embodiments, the one or more heat dissipation elements may include fins. These fins may also be disposed substantially perpendicular with respect to the bottom cage member.

In some cases, the heat dissipation unit may include a first set of heat dissipation elements having a first height, and a second set of heat dissipation elements having a second height, wherein the second height is different than the first height. In such a case, the second height of the second set of heat dissipation elements may be greater than the first height of the first set of heat dissipation elements such that a portion of the second set extends through a plane defined by an inner surface of the heat dissipation unit corresponding to a location of the first set of heat dissipation elements.

In other embodiments, the top portion of the top cage member may define an opening configured to receive one or more additional heat dissipation units, wherein each heat dissipation unit includes one or more heat dissipation elements. In such an embodiment, the one or more heat dissipation elements of the one or more additional heat dissipation units may include fins.

In any of the above embodiments, the cable connector may be a quad small form-factor pluggable cable connector.

In other embodiments, a method of manufacturing a cage receptacle assembly configured to receive a cable connector is provided. The method may include providing a top cage member defined by a top portion and two side portions and providing a bottom cage member defining an opening. The method may include attaching the bottom cage member to the top cage member via the two side portions of the top cage member to form a cage body defining a first end and a second end. The cage body may define a receiving space configured to at least partially receive a cable connector therein via the first end such that a top surface of the cable connector is disposed proximate the top cage member and a bottom surface of the cable connector is disposed proximate the bottom cage member, and the second end may be configured to be received by a datacenter rack for enabling signals to pass between the cable connector that is at least partially received therein and the datacenter rack. The method may also include disposing a heat dissipation unit within the opening. The heat dissipation unit may include one or more heat dissipation elements configured to allow heat to be transferred from the cable connector that is at least partially received within the receiving space to an external environment of the cage receptacle assembly.

In some embodiments, the method may also include disposing a printed circuit board assembly adjacent the bottom cage member, and the printed circuit board assembly may define a corresponding opening configured to substantially align with the opening defined by the bottom cage member. In such an embodiment, the printed circuit board assembly adjacent the bottom cage member may be configured such the heat dissipation unit disposed within the opening defined by the bottom cage member is disposed within the corresponding opening of the printed circuit board assembly.

In some cases, the heat dissipation unit may be dimensioned such that, when disposed within the corresponding opening of the printed circuit board assembly, contact between the heat dissipation unit and the printed circuit board assembly is precluded.

In other cases, in an instance in which the cable connector is at least partially received within the cage body, the cage receptacle assembly may be further configured such that the heat dissipation unit contacts the cable connector.

In some further embodiments, the heat dissipation unit may include a first set of heat dissipation elements having a first height, and a second set of heat dissipation elements having a second height, wherein the second height may be different than the first height. In such an embodiment, the second height of the second set of heat dissipation elements may be greater than the first height of the first set of heat dissipation elements such that a portion of the second set extends through a plane defined by an inner surface of the first set of heat dissipation elements.

In some embodiments, a cage receptacle assembly may be provided that includes a cage body defining a first end and a second end. The cage body may include a top cage member defined by a top portion and two side portions. The cage body may define a receiving space configured to at least partially receive a cable connector therein via the first end such that a top surface of the cable connector is disposed proximate the top cage member and a bottom surface of the cable connector is disposed proximate the bottom cage member, and the second end may be configured to be received by a datacenter rack for enabling signals to pass between the cable connector that is at least partially received therein and the datacenter rack. The cage receptacle assembly may include a printed circuit board assembly attached to the top cage member via the two side portions of the top cage member. The printed circuit board assembly may define an opening. The cage receptacle assembly may also define a heat dissipation unit disposed within the opening. The heat dissipation unit may further include one or more heat dissipation elements configured to allow heat to be transferred from the cable connector that is at least partially received within the receiving space to an external environment of the cage receptacle assembly.

BRIEF DESCRIPTION OF THE SEVERAL VIEWS OF THE DRAWING(S)

Having thus described the disclosure in general terms, reference will now be made to the accompanying drawings, which are not necessarily drawn to scale, and wherein:

DETAILED DESCRIPTION OF THE DRAWINGS

Figure 1:
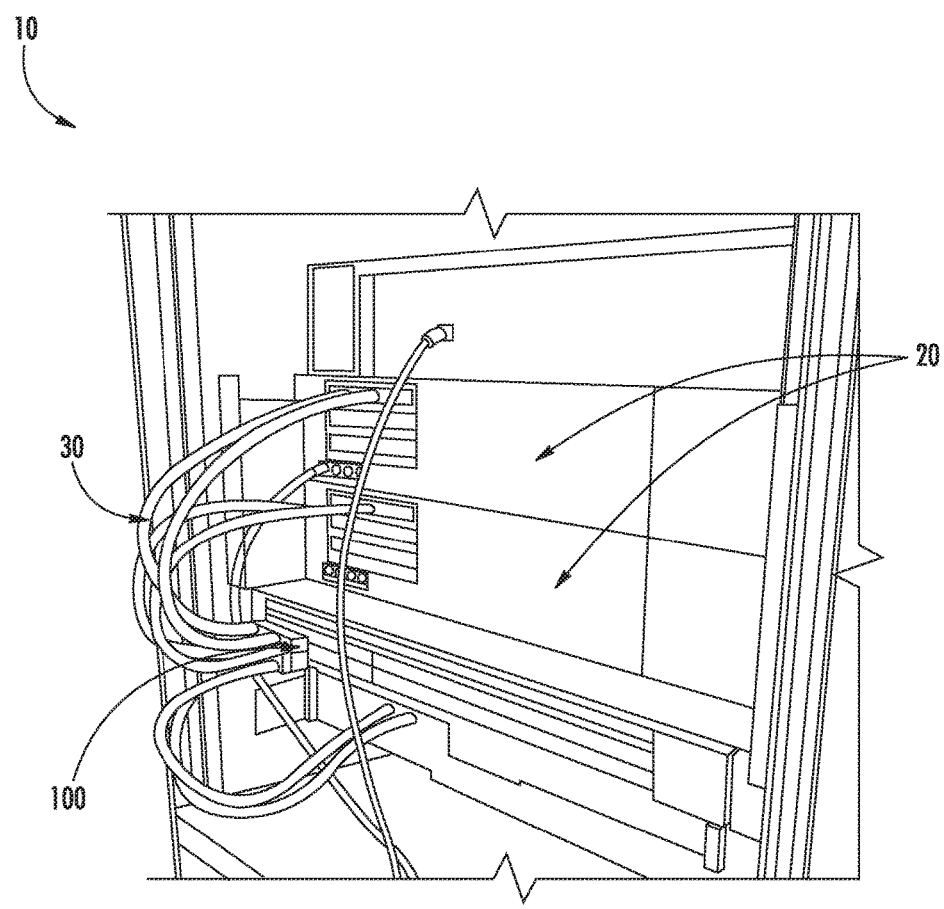
FIG. 1 is a front perspective view of a rack of switch modules in a datacenter for use in accordance with some embodiments discussed herein.

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used in the examples provided below to describe the position of certain components or portions of components in an installed and operational configuration. As used herein, the term "module" encompasses hardware, software and/or firmware configured to perform one or more particular functions, including but not limited to conversion between electrical and optical signals and transmission of the same. As would be evident to one of ordinary skill in the art in light of the present disclosure, the term "substantially" indicates that the referenced element or associated description is accurate to within applicable engineering tolerances.

As discussed herein, the example embodiment is described with reference to a Quad Small Form-factor Pluggable (QSFP) connector as the cable connector; however, the embodiments of the present invention may be equally applicable for use with any connector (e.g., Small Form Pluggable (SFP), C-Form-factor Pluggable (CFP), and the like). Moreover, the embodiments of the present invention may also be used with any cable (e.g., passive copper cable (PCC), active copper cable (ACC), or the like) or interconnect utilized by datacenter racks and associated switch modules (e.g., an active optical module (AOM), QSFP transceiver module, or the like). Additionally, as discussed herein, the example embodiment is described with reference to a vertical-cavity surface-emitting laser (VCSEL) as an element of a transceiver system; however, embodiments of the present invention may be equally applicable for use with any transceiver system and/or element. Still further, as discussed herein, the example embodiment is described with reference to a switch module configured to receive a cage receptacle assembly to allow signals to pass between a cable connector and the switch module. The present disclosure, however, contemplates that a network interface, a high-capacity adapter, or any other applicable networking interface may equally be used instead or in conjunction with the switch module to receive the cage receptacle.

Extensive growth in global internet traffic due to increasing demands for high-definition video and high-speed broadband penetration has required new hardware that allows for higher data transmission rates in datacenters. These developments have resulted in the use of optical fibers offering enhanced capacity (e.g., greater bandwidth) over distance, increased bandwidth density, greater security and flexibility, and lower costs as compared to conventionally-used copper cables. A conventional datacenter rack 10, or cabinet that is designed to house servers, networking devices, modules, and other datacenter computing equipment and used in conjunction with optical fibers, is depicted in FIG. 1.

Accordingly, various different types of cable connectors also exist for enabling transmission of signals (optical and/or electrical) between switch modules and other equipment in a datacenter. For example, QSFP connectors and cables, as well as other forms of connectors such as Small Form Pluggable (SFP) and C-Form-factor Pluggable (CFP) connectors, have long been the industry standard for providing high-speed information operations interface interconnects. More recently, Octal Small Form-factor Pluggable (OSFP) transceivers have come about to provide increased bit rate capabilities of up to 400 Gbps. Regardless of the type of cable connector, these transceivers may interface a switch system board, such as a motherboard in a switch system, to a fiber optic or copper networking cable, such as by making connections between switch modules 20 as shown in FIG. 1.

With continued reference to FIG. 1, for example, a switch module 20, which may house an application-specific integrated circuit (ASIC) as well as other internal components (not visible), is typically incorporated into a datacenter network via connections to other switch systems, servers, racks, and network components. A switch module 20 may, for example, interact with other components of the datacenter via external optical cables 30 and possible transceiver systems housed in the end of an optical cable. These optical cables 30 and transceivers may allow connections between a switch module and the other components of the datacenter network via cage receptacle assemblies 100.

The switch modules 20 may be configured to be received by a datacenter rack 10 and may be configured to allow for the conversion between optical signals and electrical signals. For example, optical cables 30 may carry optical signals as inputs to the switch module 20. The optical signals may be converted to electrical signals via an opto-electronic transceiver assembly, which may form part of the optical cable 30 in cases in which the optical cable 30 is an Active Optical Cable (AOC), such as a cable that includes a QSFP connector that is received by a port of a switch module 20. In other cases, the optical cable 30 may be passive, and the switch module 20 may include opto-electronic components that convert between optical signals and electrical signals. The electrical signals may then be processed by the switch module 20 and/or routed to other computing devices, such as servers and devices on other racks or at other datacenters via other components and cables (not shown). In addition, electrical signals received from other networking devices (e.g., from other datacenters, racks, etc.) may be processed by the switch module 20 and then converted into corresponding optical signals to be transmitted via the optical cables 30, going the opposite direction.

With continued reference to the datacenter rack 10 of FIG. 1, the transmission of data as electrical signals and the conversion between optical signals and electrical signals (e.g., via an AOC 30 and associated transceiver system or AOM) often results in the generation of heat by the components of the datacenter rack 10. As would be understood by one of ordinary skill in the art in light of the present disclosure, higher temperatures associated with such heat emissions can correspond to the increased likelihood of failure of electrical components and/or changes in the electrical and/or optical operating parameters of the components resulting in interference with the corresponding electrical and/or optical signals. Additionally, localization or concentration of higher temperatures in electrical components (e.g., the bottom surface of the AOC, AOM, or QSFP cable connector) can result in a further increase in the likelihood of failure of electrical components located near the area of concentration.

Traditional attempts at preventing or reducing this localization or concentration of higher temperatures have focused on a top surface of the switch module 20 (e.g., a top cage member 104 in FIGS. 2-7 and 10-11 described below). For example, some industry standards for pluggable optical modules with active components (e.g., a cage receptacle assembly 100 receiving a cable connector 102) require a thermal solution (e.g., a heat sink) located on a top surface of the optical module to help dissipate heat from the top surface of the cable connector (e.g., the cable connector 102 in FIG. 10) received therein. For example, industry Multi-Source Agreements ("MSAs") require a heat sink attached to the top surface of an SFP (e.g., cable connector 102) and further define industry acceptable dimensions for the heat sink. These industry standards and traditional attempts at improving the heat dissipation of switch modules 20 and associated cage receptacle assemblies (e.g., cage receptacle assembly 100), however, fail to include thermal solutions to increase heat dissipation from a bottom surface of the switch module 20.

Accordingly, embodiments of the invention described herein provide an cage receptacle assembly that is configured to provide increased thermal efficiency by utilizing nontraditional heat dissipation element configurations to more evenly distribute heat and/or to more effectively dissipate the heat to the surrounding environment to maintain lower temperatures in the components, with a particular focus on the bottom surface of the cage receptacle assembly.

Figure 2:
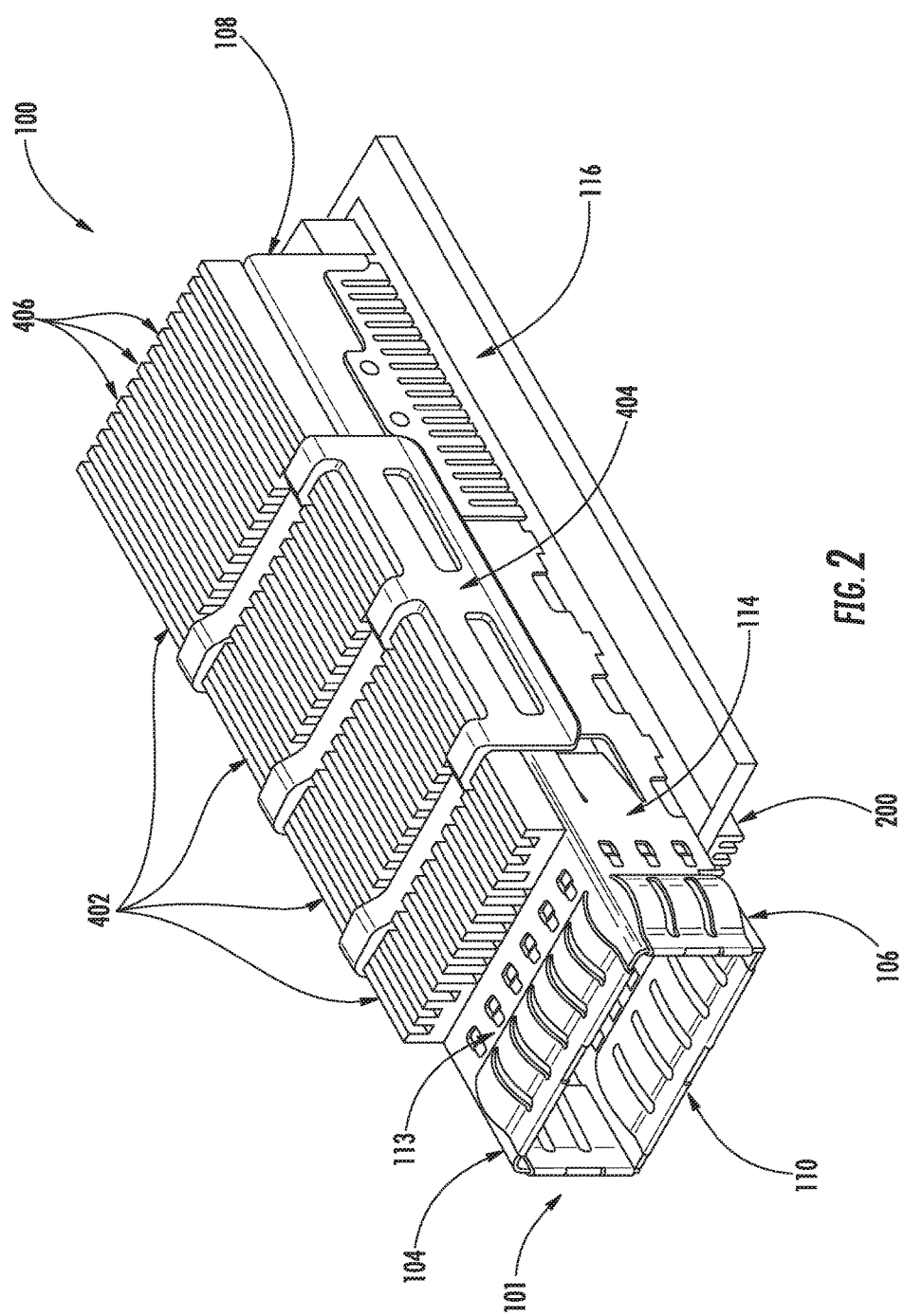
FIG. 2 is a perspective view of an cage receptacle assembly in accordance with some embodiments discussed herein.
Figure 3:
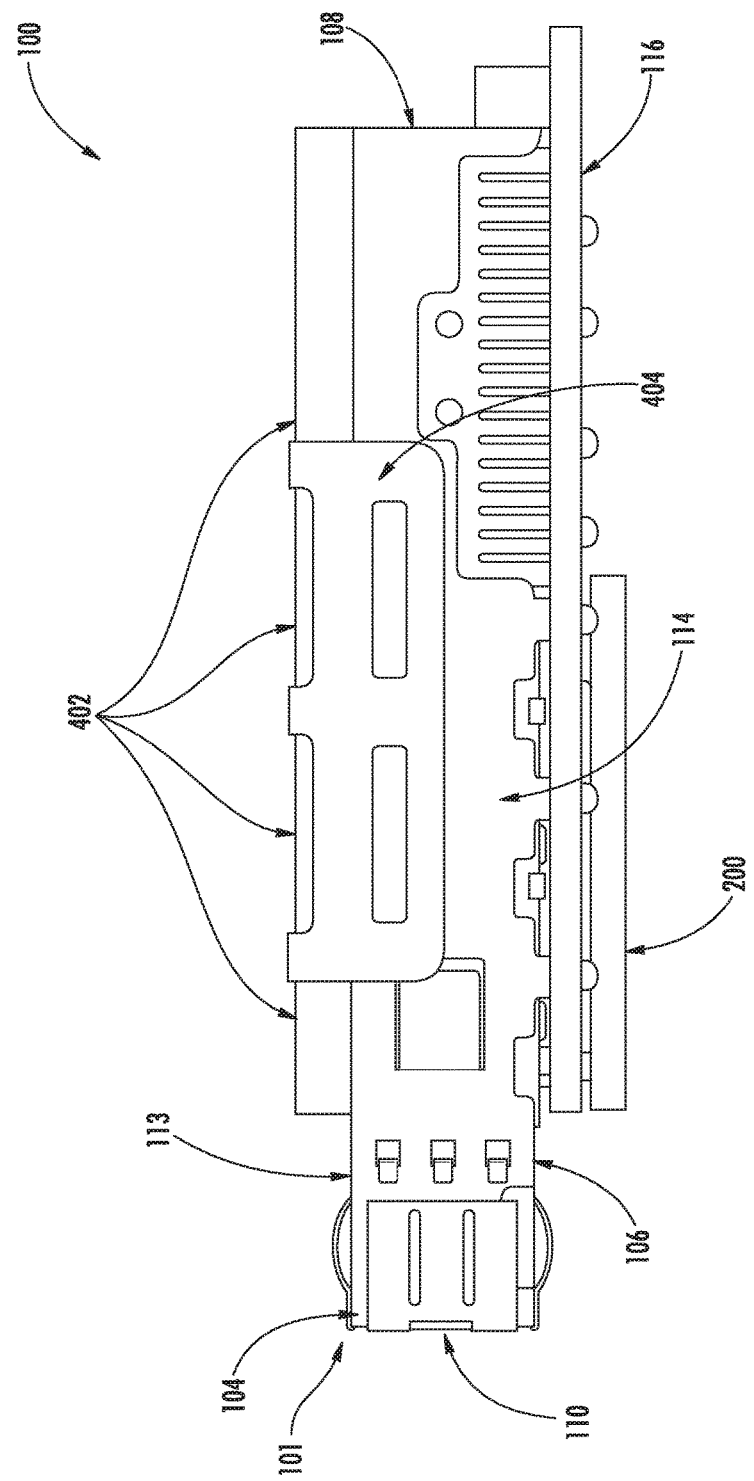
FIG. 3 is a side view of the assembly of FIG. 2 according to an example embodiment.
Figure 4:
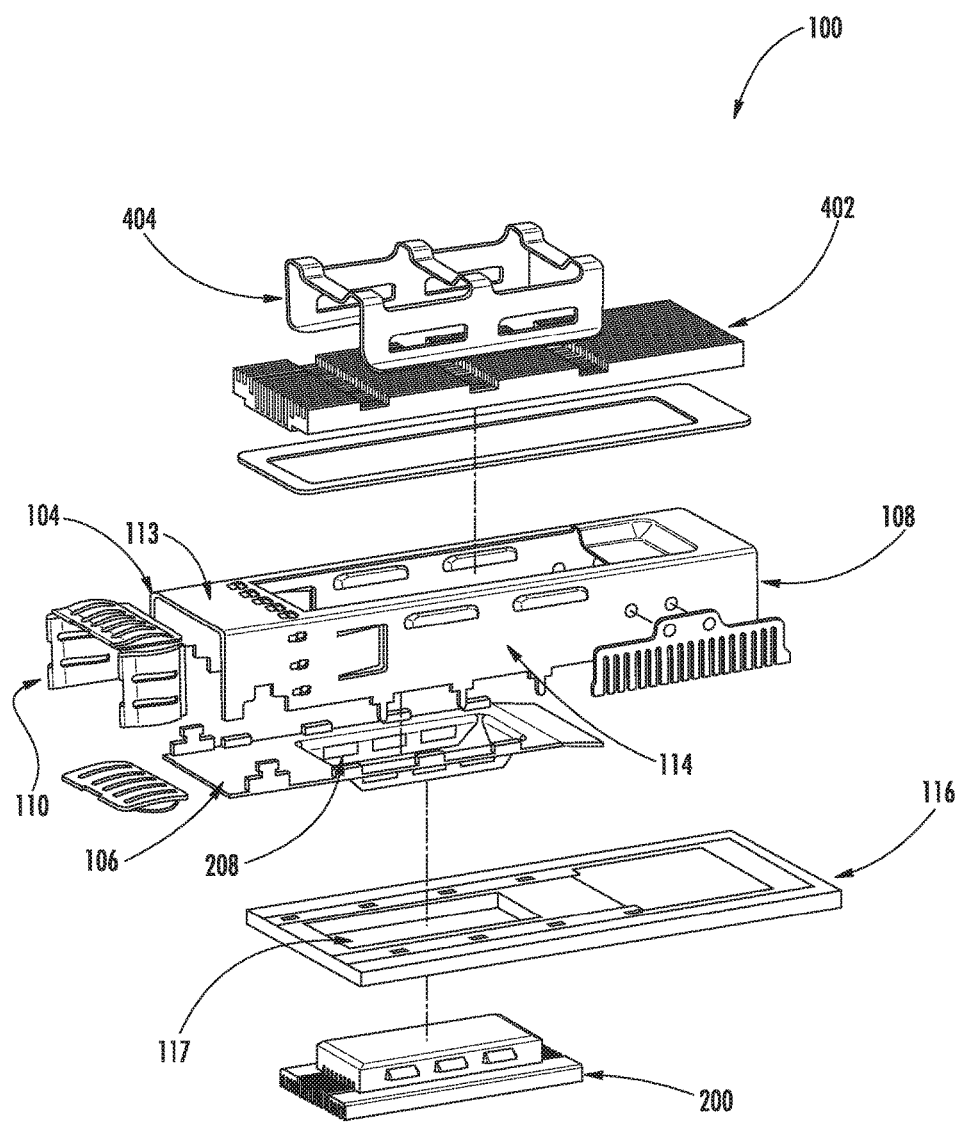
FIG. 4 is an exploded view of the assembly of FIGS. 2-3 according to an example embodiment.

With reference to FIGS. 2-4, a cage receptacle assembly 100 and associated a cage body 101 are illustrated. The cage body 101 of the cage receptacle assembly 100 may be defined by a top cage member 104 that defines a top portion 113 and two side portions 114 that extend between the top portion 113 of the top cage member 104 to a bottom cage member 106. The top cage member 104 may be configured to attach to the bottom cage member 106 to form the cage body 101. As will be discussed hereinafter with reference to FIGS. 6-7, the bottom cage member 106 of the cage receptacle assembly 100 may further define an opening 208. The cage body 101 of the cage receptacle assembly 100 may be configured to at least partially receive a cable connector 102 (e.g., a QSFP cable and/or connector) such that a top surface of the cable connector 102 is disposed proximate the top cage member 104 and a bottom surface of the cable connector is disposed proximate the bottom cage member 106. Said differently, the top surface of the cable connector 102 may be closer to the top cage member 104 than the bottom cage member 106 such that heat from the top surface of the cable connector 102 is dissipated via the top cage member 104. The bottom surface of the cable connector 102, however, may be closer to the bottom cage member 106 than the top cage member 104 such that heat from the bottom surface of the cable connector 102 is dissipated via the bottom cage member 106. By way of example, the cage body 101 of the cage receptacle assembly 100 may define a channel, through-hole, or other space (e.g., receiving space 210 in FIG. 6) configured to receive at least a portion of the cable connector 102, such that the cage body 101 at least partially surrounds that portion. Although the cage body 101 is described herein as an attachment between the top cage member 104 and the bottom cage member 106, the present disclosure contemplates that, in some embodiments, the bottom cage member 106 may be integral to the top cage member 104. Said another way, the cage body 101 of the cage receptacle assembly 100 may be created as a single body (via an extrusion process or the like).

Figure 10:
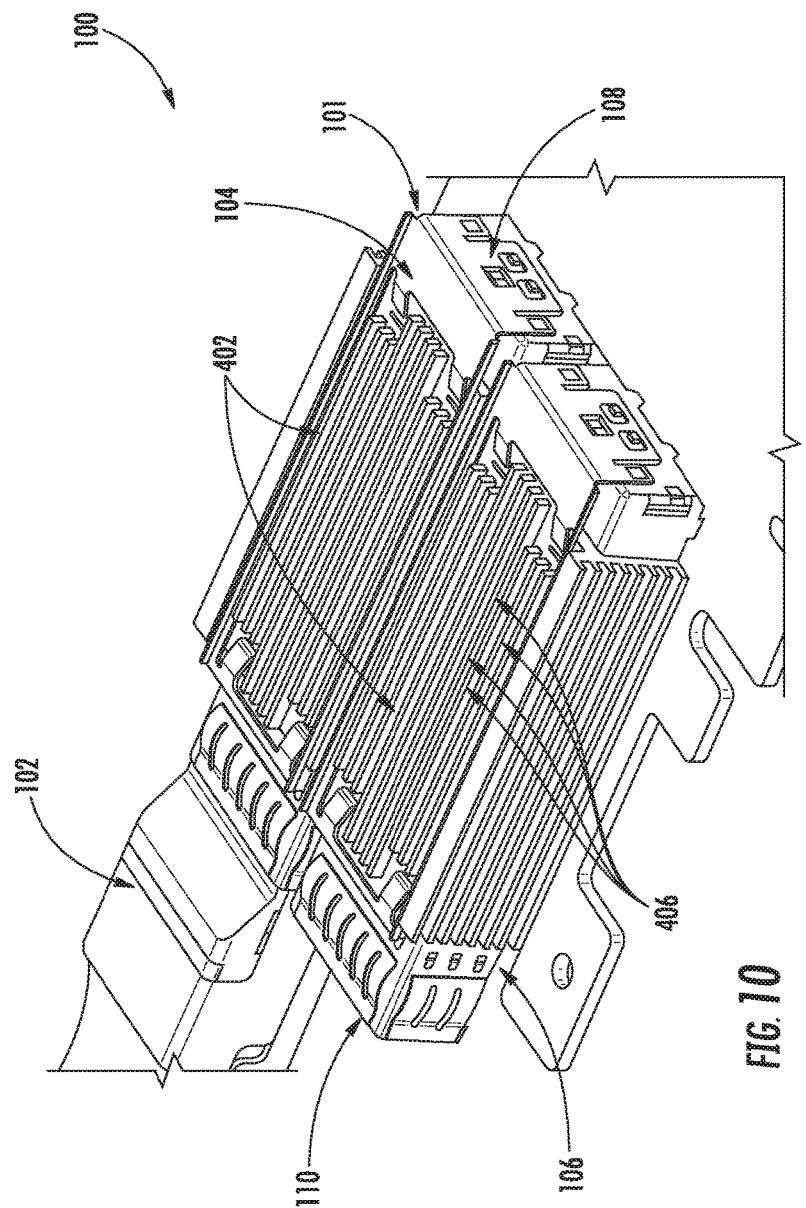
FIG. 10 is a top perspective view of the cage receptacle assembly with additional top heat dissipation units according to an example embodiment.

The cage receptacle assembly 100 may also define a first end 110 and a second end 108 opposite the first end 110, where the first end 110 is in communication with the receiving space 210 and is configured to receive a cable connector (e.g., cable connector 102 in FIG. 10). As illustrated in FIG. 10, further described hereinafter, the first end 110 of the cage receptacle assembly 100 may be defined such that at least a portion of the cable connector 102 may be inserted into the cage receptacle assembly 100, or otherwise brought into engagement or contact with an inner surface of cage receptacle assembly 100 via the first end. The first end 110 may be configured to receive a cable connector 102 of any dimension or of any type (e.g., AOC, Ethernet, Direct Attach Copper, etc.) such that the top cage member 102 is located proximate the top surface of the cable connector 102 and the bottom cage member 104 is located proximate the bottom surface of the cable connector 102. By way of example, the first end 110 may be configured to receive a cable connector corresponding to a QSFP cable connector, such that the QSFP is secured to the cage receptacle assembly 100 by engaging at least a part of the inner surface cage receptacle assembly 100 via the first end.

The cage receptacle assembly 100 may further define a second end 108 opposite the first end 106, where the second end 108 is configured to be received by a switch module for enabling signals to pass between the cable connector (e.g., cable connector 102 in FIG. 10) and the switch module. The cage receptacle assembly 100 may be configured to engage, or be secured to, a switch module (e.g., switch module 20 in FIG. 1). The cage receptacle assembly 100 may be configured such that the second end 108 defines at least one extension capable of being received by a datacenter switch module 20 (e.g., male to female connection). As discussed above, the opening (e.g., receiving space 210 in FIG. 6) defined by the cage body 101 of the cage receptacle assembly 100 may be such that an active end of a cable connector 102 may extend through the cage body 101 of the cage receptacle assembly 100. Specifically, the active end of the cable connector 102 may be configured (e.g., sized and shaped) such that upon engagement of the second end 108 of the cage receptacle assembly 100 with the switch module, the active end of the cable connector 102 may also engage the switch module such that signals may be transmitted between the cable and switch module. By way of a more particular example, a QSFP may be received by the cage receptacle assembly 100 such that at least a portion of the QSFP is supported and/or surrounded by the cage body 101 of the cage receptacle assembly 100. The active end of the QSFP (e.g., the end configured to engage a datacenter switch module and allow electrical communication therethrough) may be positioned such that when the cage receptacle assembly 100 engages a datacenter switch module, the active end of the QSFP engages a corresponding port of the switch system to allow signals (e.g., electrical signals, optical signals, or the like) to travel between the QSFP and the switch module.

With continued reference to FIGS. 2-4, the cage receptacle assembly 100 may also, in some embodiments, include a printed circuit board assembly ("PCB") 116 disposed adjacent the bottom cage member 106. The PCB assembly 116 may be attached or otherwise secured to the cage receptacle assembly 100. As would be understood by one of ordinary skill in the art in light of the present disclosure, the PCB 116 may include various optical and/or electrical components. In some embodiments, the PCB 116 may include one or more transducers (e.g., vertical-cavity surface-emitting lasers ("VCSELs")) configured to convert electrical signals into optical signals, and/or one or more photodiodes configured to convert optical signals into electrical signals. As shown in the exploded view of FIG. 4, the PCB 116 may define an opening 117 configured to substantially align with the opening 208 defined by the bottom cage member 106. A heat dissipation unit 200, described in greater detail below, may be received by the opening 208 and may be further configured to be disposed within the corresponding opening 117 of the PCB 116 when the heat dissipation unit 200 is disposed within the opening 208 of the bottom cage member 106.

Figure 6:
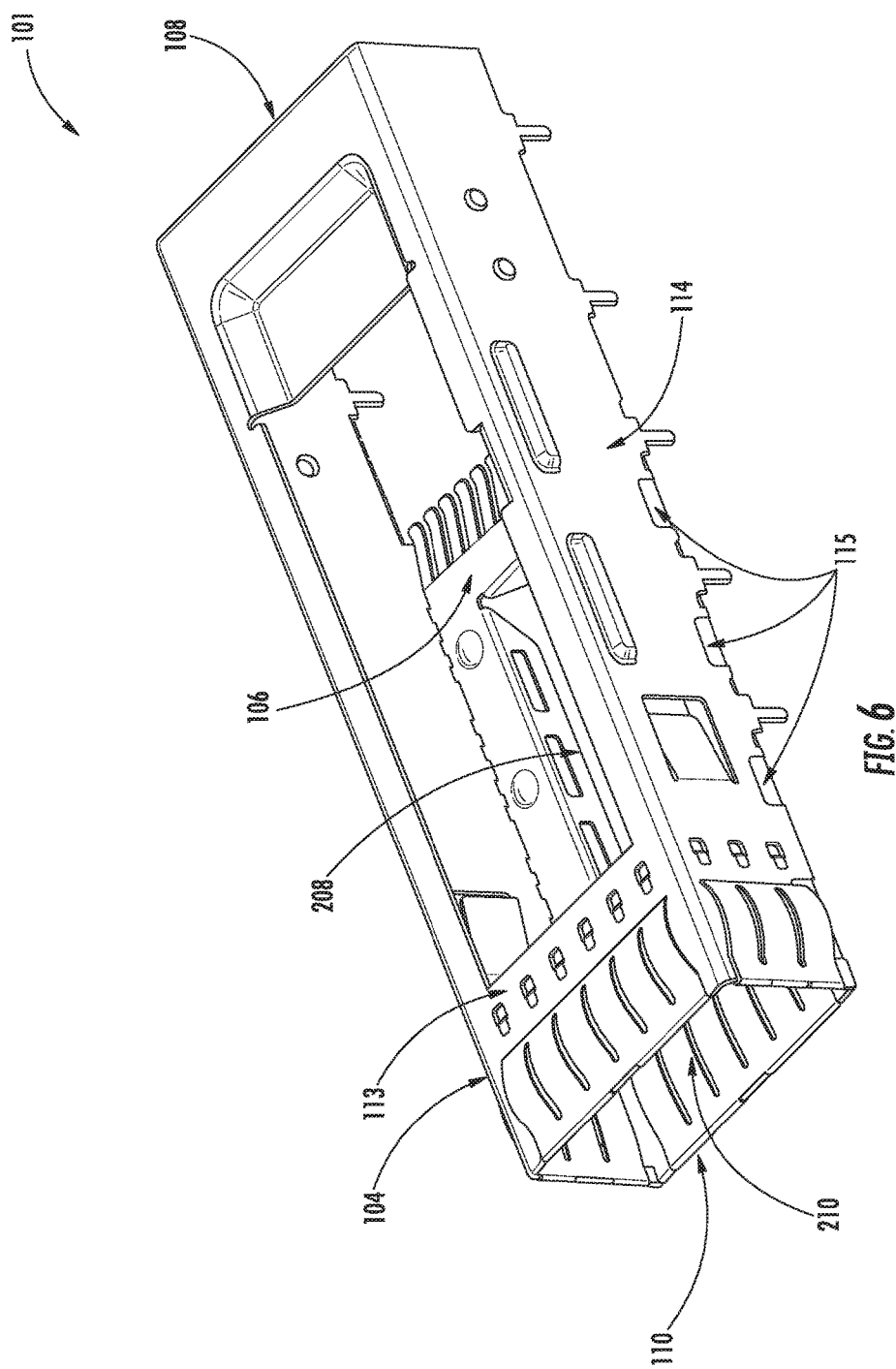
FIG. 6 is a perspective view of the cage body of the cage receptacle assembly of FIGS. 2-5 according to an example embodiment.
Figure 8:
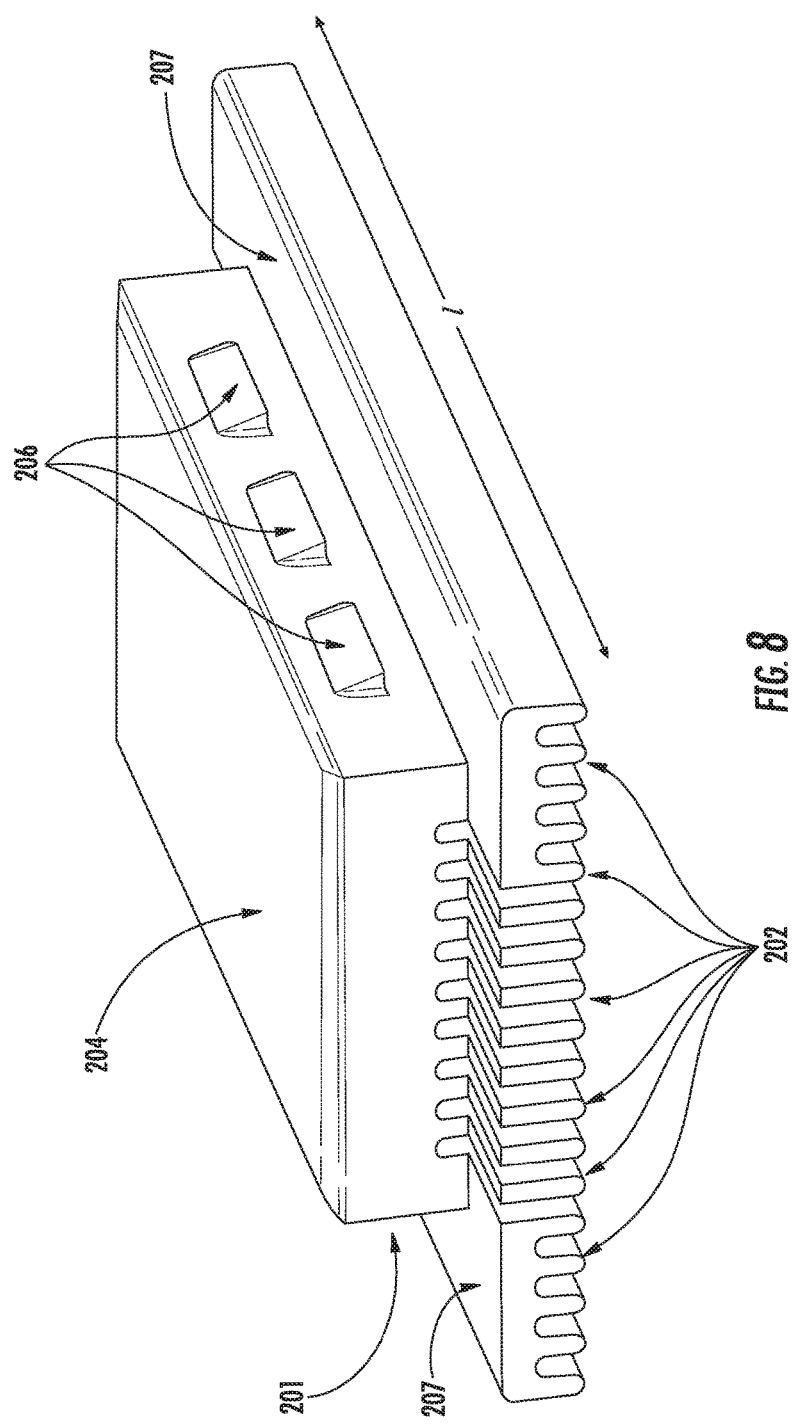
FIG. 8 is a perspective view of a bottom heat dissipation unit according to an example embodiment.

The heat dissipation unit 200 may be received by the opening 208 of the bottom cage member 106 and may be attached to the cage body 101 via one or more attachment elements 206 (e.g., snaps, fasteners, or the like), shown in FIG. 8, engaging corresponding attachment openings 115 defined in the cage body 101, as shown in FIG. 6. As illustrated in the exploded view of FIG. 4, in some embodiments in which a PCB 116 is disposed adjacent the bottom cage member 106, the heat dissipation unit 200 may also be received by the corresponding opening 117 of the PCB 116. In such an embodiment, the heat dissipation unit 200 may be dimensioned such that contact between the heat dissipation unit 200 and the PCB 116 is precluded. Further, the dimensioning of the corresponding opening 117 may be such that the heat dissipation unit 200 is fully received by the opening 208 of the bottom cage member 106. Said another way, the opening 117 may be dimensioned such that the PCB 116 does not inhibit contact between the heat dissipation unit 200 and a cable connector 102 at least partially received by the cage receptacle assembly 100. For example, a width and length of the opening 117 may be larger than a width and length of a portion 201 of the heat dissipation unit 200 received via the openings 208, 117. The distance between the PCB 116 and the heat dissipation unit 200 may be configured so as to provide maximum contact between the cable connector 102 received by the cage receptacle assembly 100. Furthermore, this distance may be set by the mechanical tolerances (defined via manufacturing tolerances or the like) of the PCB 116 and the heat dissipation unit 200.

Figure 5:
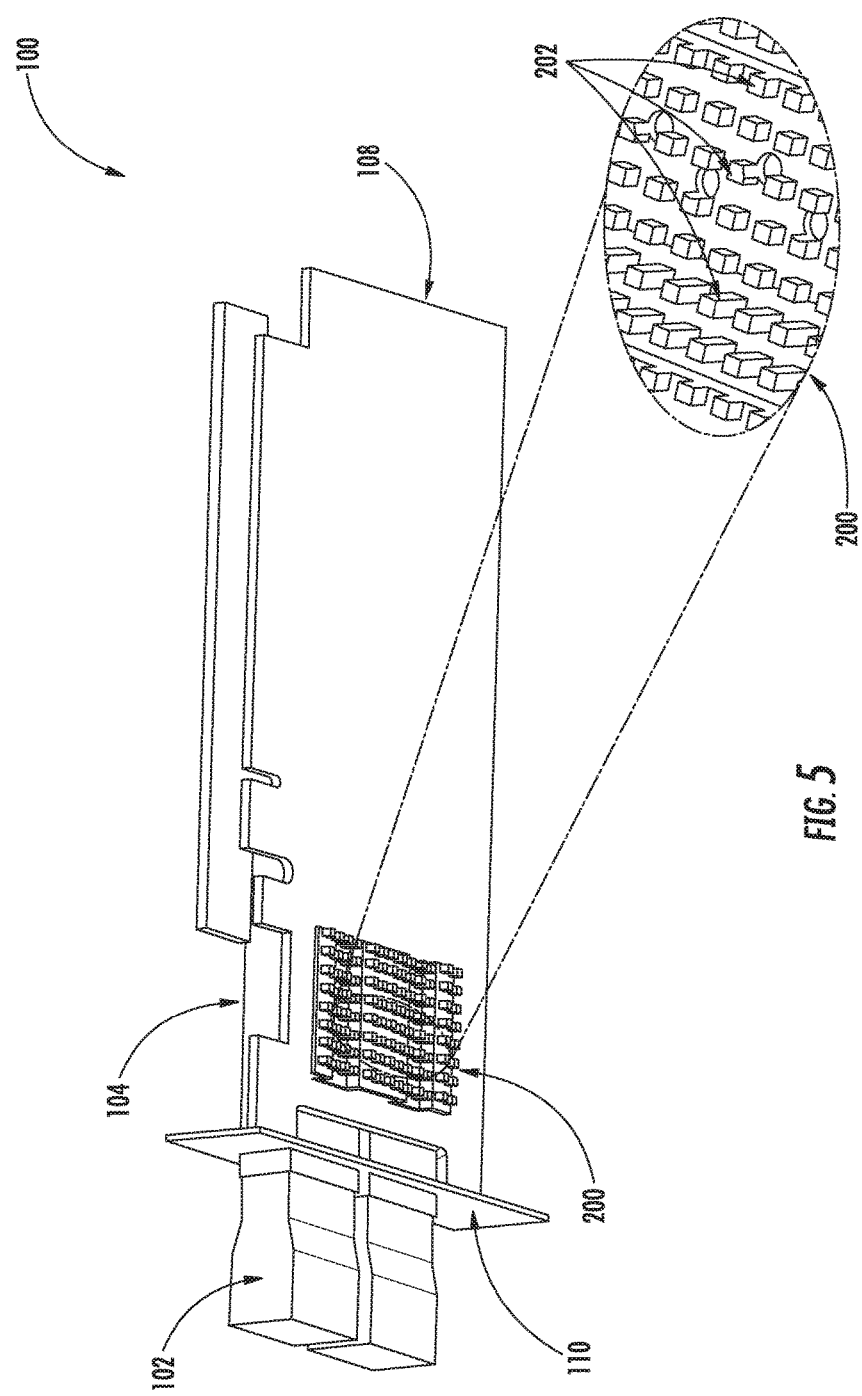
FIG. 5 is a bottom view of the assembly of FIGS. 2-4 according to an example embodiment.
Figure 9:
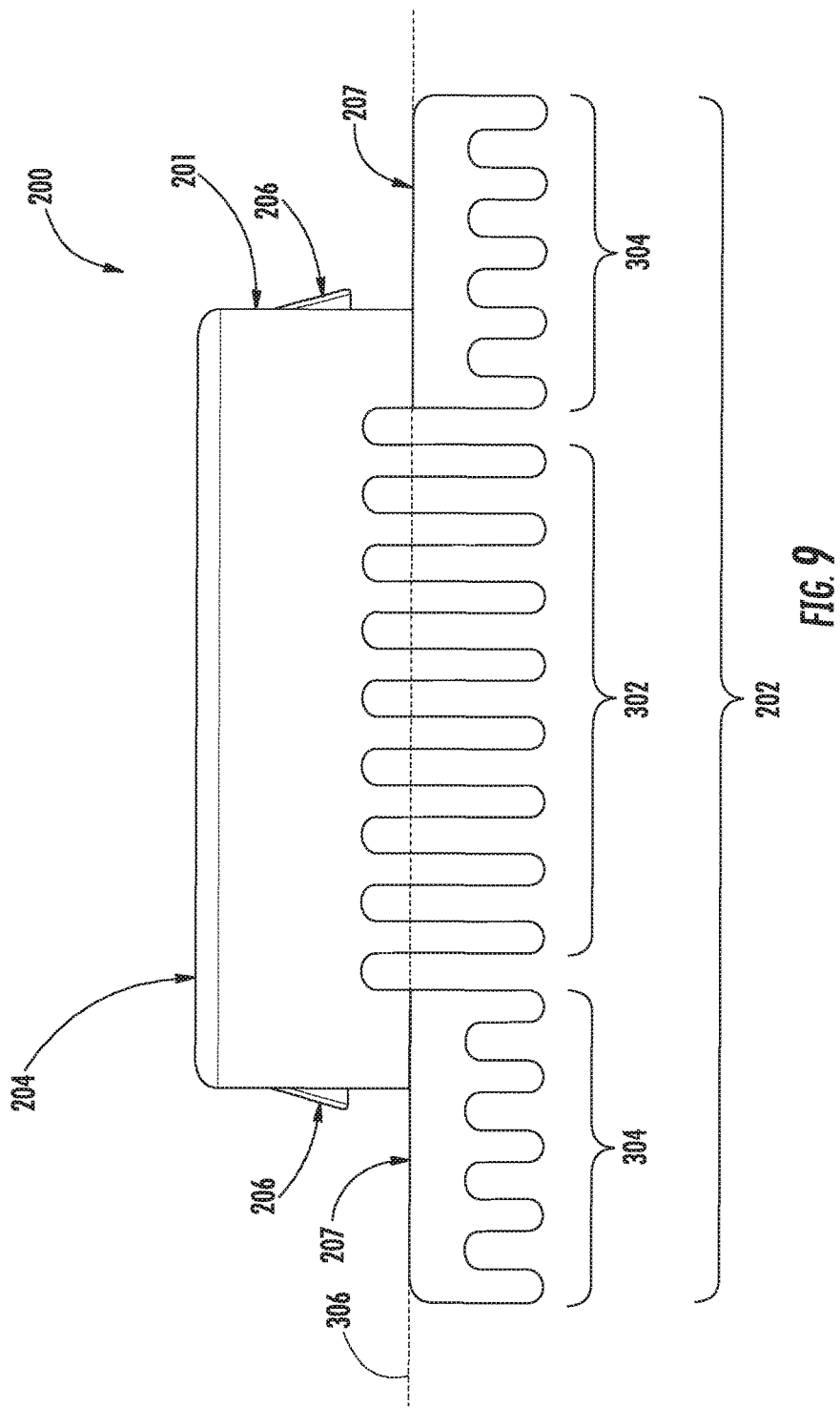
FIG. 9 is a side view of the heat dissipation unit of FIG. 8 according to an example embodiment.

The heat dissipation unit 200 may be configured to facilitate the transfer of heat from a cable connector that is at least partially received within the cage receptacle assembly 100 to an external environment of the cage receptacle assembly 100. As can be seen in FIG. 5, the heat dissipation unit 200 may, for example, define heat dissipation elements 202 (e.g., fins), which extend substantially perpendicularly outwardly with respect to the bottom cage member 106. The heat dissipation elements 202 may, in some embodiments, define a plurality of fins having rectangular cross-sections. In other embodiments, as shown in FIGS. 8-9, the heat dissipation elements 202 may define a plurality of fins. While the description herein refers to the heat dissipation elements 202 configured as pins or fins, the present disclosure contemplates that any extension having any cross-sectional shape may be used as the heat dissipation elements 202. Furthermore, the present disclosure contemplates that any number of heat dissipation elements may be defined by the heat dissipation unit 200 and may be positioned at any angle and/or arrangement with respect to the bottom cage member 106.

The one or more heat dissipation units 202 (e.g., the pluralities of fins) may facilitate the transfer of heat from the cable connector 102 to an external environment of the cage receptacle assembly 100 by increasing the convective cooling experienced by the cage receptacle assembly 100. As would be understood by one of ordinary skill in the art in light of the present disclosure, the heat dissipation unit 200 may increase the rate of heat transfer to an external environmental via the increased surface area provided by the heat dissipation elements 202 in the portion of the cage receptacle assembly 100 contacting the external environment. In other words, by utilizing a heat dissipation unit 200 including heat dissipation elements 202 (e.g., a plurality of fins), the cage receptacle assembly 100 may increase its surface area for heat dissipation such that a larger area is in contact with the air of its external environment (e.g., the air from the environment that is contained and/or flowing through the one or more heat dissipation elements 202). As such, air traveling between and around the fins is able to receive more heat transferred from the body of the cage receptacle assembly 100 than it would have otherwise if contacting a single, flat surface. As a result, the temperature of the heat dissipation unit 200 (e.g., at the ends of the pluralities of fins) should remain lower than the temperature of the rest of the cage body 101 of the cage receptacle assembly 100 (e.g., the combined top cage member 104 and bottom cage member 106) to provide a larger temperature gradient between these surfaces, thereby serving as a heat sink. The resultant temperature gradient also facilitates transfer of heat from the cage receptacle assembly 100 and optical connector cable 102 to the external environment.

Figure 7:
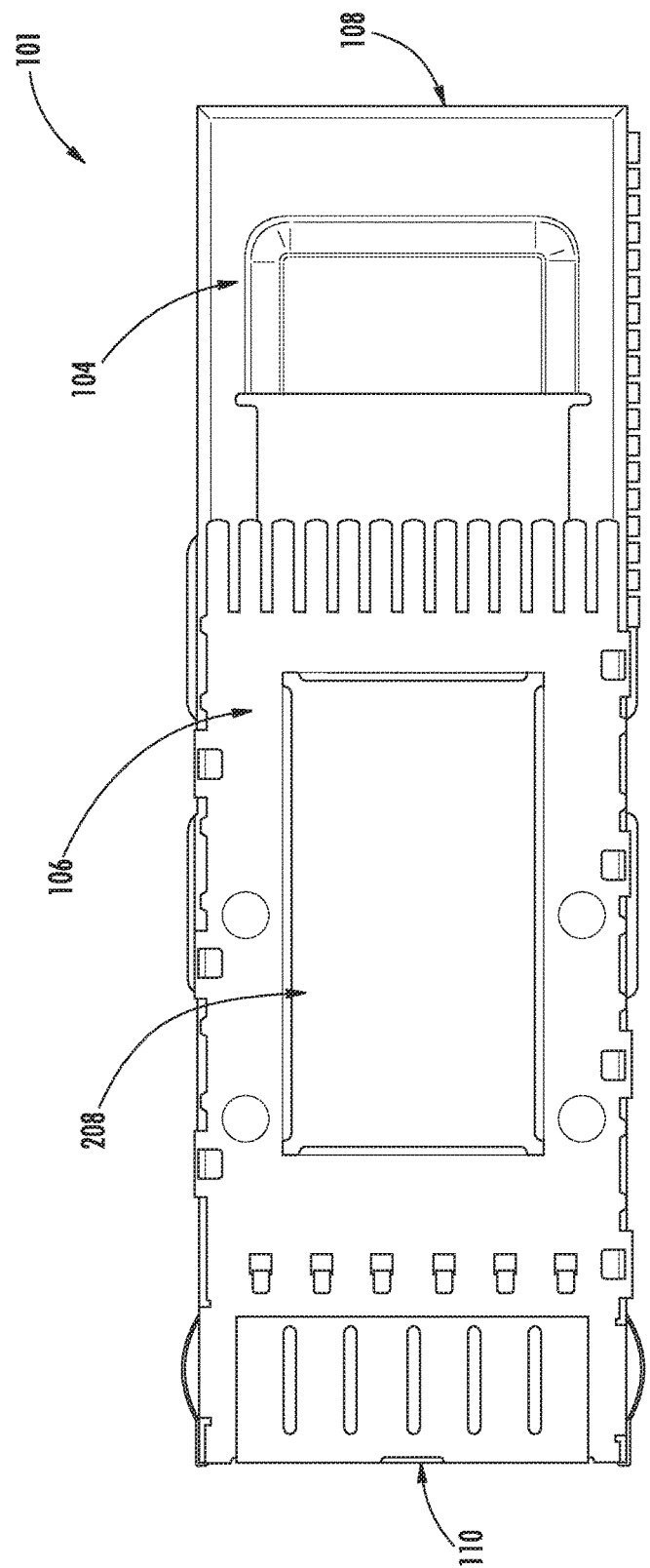
FIG. 7 is a bottom view of the cage body of FIG. 6 according to an example embodiment.

As would be understood by one of ordinary skill in the art in light of the present disclosure, with reference to FIG. 8, the one or more heat dissipation elements 202 (e.g., the pluralities of fins) may improve heat dissipation from the cage receptacle assembly 100 by providing contact between the contact surface 204 of the heat dissipation unit 200 and the cable connector 102 that is at least partially received within the cage receptacle assembly 100. With reference to FIGS. 6-7, the opening 208 of the bottom cage member 106 may be configured such that the heat dissipation unit 200 contacts a bottom surface of a cable connector 102 when the connector is at least partially received by the cage receptacle assembly 100 (e.g., disposed within the cage receptacle assembly 100). In such an embodiment, a portion of the heat dissipation unit 200 may extend partially into the cage body 101 to contact a bottom surface of the cable connector 102 (e.g., via contact surface 204).

By increasing the contact area between elements (e.g., between a portion of a bottom surface of the cable connector 102 and an inner portion of the cage body 101) heat may more freely transfer between the connector assembly and the cable connector. In particular, the density of atoms found in solid materials is considerably larger than the density of atoms found is gases. This larger atomic density encourages heat transfer due to increased contact at an atomic level. Therefore, increasing the contact area between solid elements as opposed to gases disposed between the cage body 101 of the cage receptacle assembly 100 and the cable connector 102 may improve the heat transfer to an external environment.

Furthermore, the heat dissipation unit 200 of the present disclosure may, in some embodiments, further improve heat dissipation from the cable connector 102 via contact between the heat dissipation elements 202 and a relatively cooler air flow otherwise unavailable to other portions of the cage receptacle assembly. As compared to other areas of the cage receptacle assembly 100, the bottom side of the cage receptacle assembly (e.g., proximate the bottom cage member 106) may be exposed to relatively cooler conditions than, for example, the top side of the cage receptacle assembly (e.g., proximate the top cage member 104) due to the arrangement and/or configuration of the internal components housed within the cage receptacle assembly and/or surrounding structures (e.g., the switch module receiving the cage receptacle assembly). As such, any heat dissipation units (e.g., the one or more additional heat dissipation units 402 in FIG. 10) disposed on the top cage member 104 of the cage receptacle assembly 100 may receive relatively warmer air flow from adjacent heat dissipation elements or optoelectrical components, while the heat dissipation unit 200 disposed on the bottom cage member 106 may be positioned such that an air flow external to the cage receptacle assembly 100, which is therefore cooler, contacts the heat dissipation elements 202. Said another way, the heat dissipation unit 200 may receive air flow which has yet to receive heat transferred from the cage receptacle assembly 100, while heat dissipation elements on the top cage member 104 may receive airflow which has been warmed (e.g., via heat transferred from the cage receptacle body 100 upstream) prior to contacting said heat dissipation elements.

With reference to FIGS. 8-9, a perspective view of one configuration of the heat dissipation unit 200 is illustrated. The heat dissipation unit 200 is shown with a first set of the heat dissipation elements 304 and a second set of the heat dissipation elements 302. As shown, in some embodiments, the height of the first set 304 (e.g., a first height) and the height of the second set 302 (e.g., a second height) may be different. In the illustrated embodiments, the heat dissipation unit 200 is configured such that some of the elements (e.g., the second set 304) have a greater height than others of the heat dissipation elements. For example, in some embodiments, the second set 302 may be sized to extend into the receiving space 210 (via occupying some or all of the height of portion 201). As shown in FIG. 9, a plane 306 may be defined by an intermediate surface 207 of the first set of heat dissipation elements 304. In such an embodiment, the second height (e.g., the height of the second set of heat dissipation elements 302) may be greater than the first height (e.g., the height of the first set of heat dissipation elements 304) such that a portion of the second set extends through the plane 306 defined by the intermediate surface 207 of the first set of heat dissipation elements 304, partially entering the receiving space 210 (via occupying some or all of the height of portion 201) defined by the body of the cage receptacle assembly 100 when assembled with the cage body 101 as shown in FIGS. 2 and 3.

Due to the increased height of the second set of heat dissipation elements 302, which are accommodated by allowing them to extend through the plane 306, the resulting surface area in contact with the external environment is increased and, consequently, the convective cooling experienced by the cage receptacle assembly 100 is also increased. Additionally, the dimensioning of the heat dissipation elements 202 may be such that the overall dimensions of the cage receptacle assembly 100 are unchanged. Particularly, the cage receptacle assembly 100 of the present invention may maintain an industry accepted footprint (e.g., meeting industry standards with respect to dimension specifications) while increasing the thermal efficiency via increased surface area of the one or more heat dissipation elements 202 in the manner described herein. Although described herein with reference to the second set 302 having a greater height than the first set 304, the present disclosure contemplates that the first set 304 may, in some embodiments, have the greater height. Notably, the difference in height between the heat dissipation elements 202 (e.g., fins) of the first set 304 and the heat dissipation elements 202 (e.g., fins) of the second set 302 may be significant. Although FIG. 8 illustrates the heat dissipation elements 202 as longitudinal fins disposed along a length (l) of the heat dissipation unit 200, the heat dissipation elements 202 may also be configured as pins arranged along the length (l) of the heat dissipation unit 200. Additionally, the present disclosure contemplates use of any orientation or configuration of heat dissipation elements 202 (e.g., fins with cross cuts, circular cross-section pins, fins disposed diagonally, tree-like fins, porous elements, or the like) in any of the embodiments described herein.

With reference to FIG. 10, and as illustrated previously in FIGS. 2-4, the cage receptacle assembly 100 may include one or more additional heat dissipation units 402 each defining heat dissipation elements 406. These one or more additional heat dissipation units 402 may be positioned within an opening (not shown) of the top cage member 104. Further, these one or more additional heat dissipation units 402 may be secured to the cage receptacle assembly 100 via a plurality of spring-assisted contact flanges 404. Similar to the heat dissipation unit 200 received by the opening 208 of the bottom cage member 106, the one or more additional heat dissipation units 402 may function to increase the thermal efficiency of the cage receptacle assembly via contact with a top surface of a cable connector 102 at least partially received by the cage receptacle assembly 100. Example configurations of additional heat dissipation units which may be incorporated into the cage receptacle assembly 100 for use in some embodiments of the present disclosure may be found in U.S. Provisional Patent Application No. 62/487,850, filed Apr. 20, 2017, the disclosure of which is hereby incorporated by reference in its entirety. Furthermore, the heat dissipation unit 200 and/or the heat dissipation elements 202 of the present disclosure may also be configured, sized, positioned, and/or dimensioned in accordance with the embodiments of the one or more heat dissipation units (e.g., the pluralities of fins) described in U.S. Provisional Patent Application No. 62/487,850, filed Apr. 20, 2017. Said another way, the heat dissipation elements 202 may define a first set and a second set of heat dissipation elements, wherein each set defines elements of different heights for optimizing the heat dissipated from the cable connector 102 by the heat dissipation unit 200.

Figure 11:
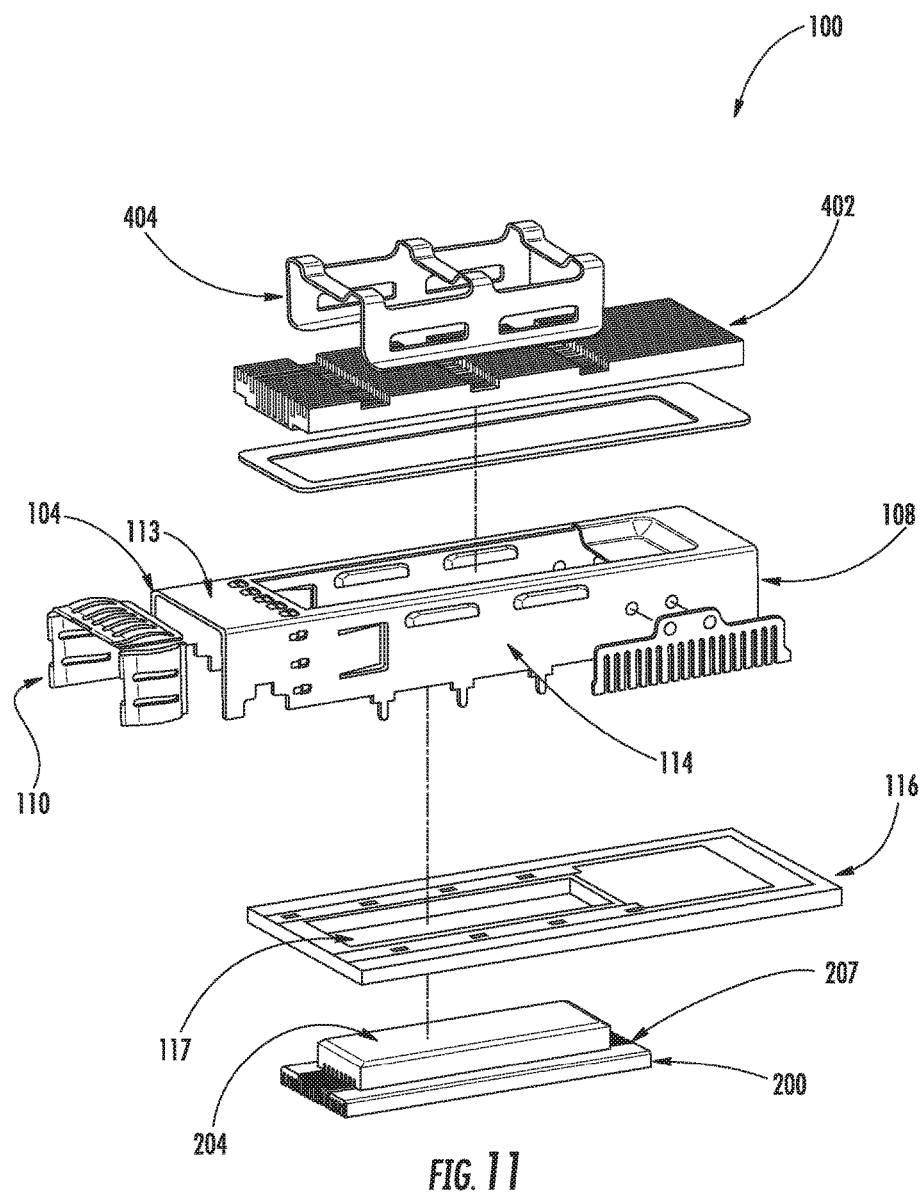
FIG. 11 is an exploded view of a cage receptacle assembly without a bottom cage member according to an example embodiment.

With reference to FIG. 11, in some embodiments, the cage receptacle assembly 100 may be formed without a bottom cage member (e.g., without the bottom cage member 106 shown in FIG. 4). In such an embodiment, the cage receptacle assembly 100 may include a printed circuit board assembly 116 ("PCB") attached to the top cage member 104 via the two side portions 114. As shown, the PCB 116 may also define an opening 117 configured to receive a heat dissipation unit 200. As depicted in FIG. 11, an intermediate surface 207 at the ends of the heat dissipation unit 200 (e.g., also shown in FIGS. 8-9) may be configured to allow the top surface 204 of the heat dissipation unit 200 to contact a cable connector received within the cage body 101 (e.g., cable connector 102 in FIG. 10). In such an embodiment without a bottom cage member, the intermediate surface 207 of the heat dissipation unit 200 may be attached to the PCB 116 via glue, soldering, screws, or any other method known in the art. With continued reference to FIG. 11, the opening 117 of the PCB 116 may be configured such that the heat dissipation unit 200 contacts a bottom surface of a cable connector 102 (e.g., FIG. 10) when the connector is at least partially received by the cage receptacle assembly 100 (e.g., disposed within the cage receptacle assembly 100). In such an embodiment, a portion of the heat dissipation unit 200 may extend partially into the cage body 101 to contact a bottom surface of the cable connector 102 (e.g., via a contact surface 204).

The present disclosure contemplates that the present invention may be created from any suitable material know in the art (e.g., carbon steel, aluminum, polymers, ceramics, and the like), particularly materials possessing high thermal conductivity. By way of example, the cage receptacle assembly 100 may be created by an extrusion and/or machine process. In such an example, a single body of fixed cross-sectional area may be produced by an extrusion process. This single body may be created via pushing a base material (e.g., a polymer) through a dimensioned die such that the cage body 101 of the cage receptacle assembly is created. In some embodiments, the single body may be created as two separate elements (e.g., a top cage member and bottom cage member) where the two separate elements are further attached to form the single body. This extruded body may then be modified through a machine process whereby material is removed from the extruded body to create the finished cage receptacle assembly 100. The machining process may include any or all of micro machining, turning, milling, drilling, grinding, water jet cutting, EDM, EDM, AFM, USM, CNC, and the like, in any order or combination. Although described as an extrusion and machine process of a single piece of material, any portion or sub-portion of the cage receptacle assembly 100 may be separately formed or attached without departing from the scope of this disclosure.

Many modifications and other embodiments of the inventions set forth herein will come to mind to one skilled in the art to which these inventions pertain having the benefit of teachings presented in the foregoing descriptions and the associated drawings. Although the figures only show certain components of the apparatus and systems described herein, it is understood that various other components (e.g., components of printed circuit boards, transceivers, cables, etc.) may be used in conjunction with the cage receptacle assembly. Therefore, it is to be understood that the inventions are not to be limited to the specific embodiments disclosed and that modifications and other embodiments are intended to be included within the scope of the appended claims.

What is claimed is:

1. A cage receptacle assembly configured to receive a cable connector, the cage receptacle assembly comprising:
   a cage body defining a first end and a second end, wherein the cage body comprises:
      a top cage member defined by a top portion and two side portions, wherein the top cage member defines a top opening, and
      a bottom cage member attached to the top cage member via the two side portions of the top cage member, wherein the bottom cage member defines a bottom opening, and wherein the cage body defines a receiving space configured to at least partially receive the cable connector therein via the first end such that a top surface of the cable connector is disposed proximate the top cage member and associated top opening and a bottom surface of the cable connector is disposed proximate the bottom cage member and associated bottom opening, wherein the second end is configured to be received by a datacenter rack for enabling signals to pass between the cable connector that is at least partially received therein and the datacenter rack;
   a heat dissipation unit disposed within the top opening of the cage body, and a heat dissipation unit disposed within the bottom opening of the cage body,
wherein each heat dissipation unit further comprises one or more heat dissipation elements configured to allow heat to be transferred from the cable connector that is at least partially received within the receiving space to an external environment of the cage receptacle assembly.

2. The cage receptacle assembly according to claim 1, further comprising a printed circuit board assembly disposed adjacent the bottom cage member, wherein the printed circuit board assembly defines a corresponding opening configured to substantially align with the opening defined by the bottom cage member.

3. The cage receptacle assembly according to claim 2, wherein the heat dissipation unit disposed within the opening defined by the bottom cage member is further configured to be disposed within the corresponding opening of the printed circuit board assembly.

4. The cage receptacle assembly according to claim 3, wherein the heat dissipation unit of the bottom opening is dimensioned such that, when disposed within the corresponding opening of the printed circuit board assembly, contact between the heat dissipation unit and the printed circuit board assembly is precluded.

5. The cage receptacle assembly according to claim 1, wherein in an instance in which the cable connector is at least partially received within the cage body, the cage receptacle assembly is further configured such that the heat dissipation unit of the bottom opening contacts the cable connector.

6. The cage receptacle assembly according to claim 1 wherein the bottom cage member is integral to the top cage member.

7. The cage receptacle assembly according to claim 1, wherein the one or more heat dissipation elements disposed within the bottom opening comprise fins.

8. The cage receptacle assembly according to claim 7, wherein the fins are disposed substantially perpendicular with respect to the bottom cage member.

9. The cage receptacle assembly according to claim 1, wherein the heat dissipation unit of the bottom opening comprises a first set of heat dissipation elements having a first height, and a second set of heat dissipation elements having a second height, wherein the second height of the second set of heat dissipation elements is greater than the first height of the first set of heat dissipation elements such that a portion of the second set extends through a plane defined by an inner surface of the heat dissipation unit corresponding to a location of the first set of heat dissipation elements.

10. The cage receptacle assembly according to claim 1, wherein the one or more heat dissipation elements of the heat dissipation units of the top opening comprise fins.

11. The cage receptacle assembly according to claim 10, wherein the one or more heat dissipation elements are longitudinal fins disposed along a length of the heat dissipation unit.

12. The cage receptacle assembly according to claim 1, wherein the cable connector is a quad small form-factor pluggable cable connector.

13. A method of manufacturing a cage receptacle assembly configured to receive a cable connector, the method comprising:
providing a top cage member defined by a top portion and two side portions, wherein the top cage member defines a top opening;
providing a bottom cage member defining a bottom opening;
attaching the bottom cage member to the top cage member via the two side portions of the top cage member to form a cage body defining a first end and a second end, wherein the cage body defines a receiving space configured to at least partially receive a cable connector therein via the first end such that a top surface of the cable connector is disposed proximate the top cage member and associated top opening and a bottom surface of the cable connector is disposed proximate the bottom cage member and associated bottom opening, wherein the second end is configured to be received by a datacenter rack for enabling signals to pass between the cable connector that is at least partially received therein and the datacenter rack;
disposing a heat dissipation unit within the top opening of the cage body, and
disposing a heat dissipation unit within the bottom opening of the cage body,
wherein each heat dissipation unit comprises one or more heat dissipation elements configured to allow heat to be transferred from the cable connector that is at least partially received within the receiving space to an external environment of the cage receptacle assembly.

14. The method of manufacture according to claim 13, further comprising disposing a printed circuit board assembly adjacent the bottom cage member, wherein the printed circuit board assembly defines a corresponding opening configured to substantially align with the opening defined by the bottom cage member.

15. The method of manufacture according to claim 14, wherein the printed circuit board assembly adjacent the bottom cage member is configured such the heat dissipation unit disposed within the opening defined by the bottom cage member is disposed within the corresponding opening of the printed circuit board assembly.

16. The method of manufacture according to claim 15, wherein the heat dissipation unit of the bottom opening is dimensioned such that, when disposed within the corresponding opening of the printed circuit board assembly, contact between the heat dissipation unit and the printed circuit board assembly is precluded.

17. The method of manufacture according to claim 13, wherein in an instance in which the cable connector is at least partially received within the cage body, the cage receptacle assembly is further configured such that the heat dissipation unit of the bottom opening contacts the cable connector.

18. The method of manufacture according to claim 13, wherein the heat dissipation unit of the bottom opening comprises a first set of heat dissipation elements having a first height, and a second set of heat dissipation elements having a second height, wherein the second height of the second set of heat dissipation elements is greater than the first height of the first set of heat dissipation elements such that a portion of the second set extends through a plane defined by an inner surface of the first set of heat dissipation elements.

19. A cage receptacle assembly configured to receive a cable connector, the cage receptacle assembly comprising:
a cage body defining a first end and a second end, wherein the cage body comprises a top cage member defined by a top portion and two side portions, wherein the top cage member defines a top opening, wherein the cage body defines a receiving space configured to at least partially receive a cable connector therein via the first end such that a top surface of the cable connector is disposed proximate the top cage member, and wherein the second end is configured to be received by a datacenter rack for enabling signals to pass between the cable connector that is at least partially received therein and the datacenter rack;

a printed circuit board assembly attached to the top cage member via the two side portions of the top cage member, wherein the printed circuit board assembly defines a bottom opening;

a heat dissipation unit disposed within the top opening, and a heat dissipation unit disposed within the bottom opening, wherein each heat dissipation unit further comprises one or more heat dissipation elements configured to allow heat to be transferred from the cable connector that is at least partially received within the receiving space to an external environment of the cage receptacle assembly.

* * * * *